US010840170B2

(12) United States Patent
Bae et al.

(10) Patent No.: US 10,840,170 B2
(45) Date of Patent: Nov. 17, 2020

(54) SEMICONDUCTOR PACKAGE SUBSTRATE AND METHOD FOR MANUFACTURING SAME

(71) Applicant: HAESUNG DS CO., LTD., Changwon-si (KR)

(72) Inventors: In Seob Bae, Changwon-si (KR); Sung Il Kang, Gimhae-si (KR)

(73) Assignee: HAESUNG DS CO., LTD., Changwon-si (KR)

( * ) Notice: Subject to any disclaimer, the term of this patent is extended or adjusted under 35 U.S.C. 154(b) by 0 days.

(21) Appl. No.: 16/829,793

(22) Filed: Mar. 25, 2020

(65) Prior Publication Data

US 2020/0227344 A1    Jul. 16, 2020

Related U.S. Application Data

(62) Division of application No. 16/079,965, filed as application No. PCT/KR2016/012915 on Nov. 10, 2016, now Pat. No. 10,643,932.

(30) Foreign Application Priority Data

Mar. 16, 2016    (KR) .................. 10-2016-0031464

(51) Int. Cl.
| | | |
|---|---|---|
| *H01L 23/495* | (2006.01) | |
| *H01L 23/492* | (2006.01) | |
| *H01L 23/498* | (2006.01) | |
| *H01L 21/48* | (2006.01) | |
| *H01L 23/00* | (2006.01) | |
| *H01L 23/14* | (2006.01) | |

(52) U.S. Cl.
CPC .... *H01L 23/49541* (2013.01); *H01L 21/4825* (2013.01); *H01L 21/4828* (2013.01); *H01L 23/492* (2013.01); *H01L 23/49503* (2013.01); *H01L 23/49586* (2013.01); *H01L 23/49861* (2013.01); *H01L 24/48* (2013.01); *H01L 23/142* (2013.01); *H01L 23/49548* (2013.01); *H01L 2224/48247* (2013.01)

(58) Field of Classification Search
CPC ............... H01L 21/4828; H01L 23/142; H01L 23/49503; H01L 24/48
USPC .................................................. 257/676, 666
See application file for complete search history.

(56) References Cited

U.S. PATENT DOCUMENTS

| | | | |
|---|---|---|---|
| 9,570,381 B2* | 2/2017 | Lu ..................... | H01L 23/49586 |
| 2002/0031869 A1* | 3/2002 | Minamio .............. | H01L 21/565 |
| | | | 438/127 |
| 2011/0042794 A1* | 2/2011 | Hsieh ................ | H01L 23/49582 |
| | | | 257/676 |

(Continued)

*Primary Examiner* — Nitin Parekh
(74) *Attorney, Agent, or Firm* — Schwabe, Williamson & Wyatt, P.C.

(57) ABSTRACT

A semiconductor package substrate, in which a base substrate having an upper surface and a lower surface and formed of a conductive material is filled with resin formed of an insulating material, includes a die pad formed of the conductive material on the upper surface and a lead arranged on the upper surface by being electrically separated from the die pad and comprising a bonding pad that is a wire bonding area. A protrusion protruding toward the lower surface is formed in a central area of the bonding pad. A central thickness of the bonding pad is greater than a peripheral thickness of the bonding pad.

7 Claims, 5 Drawing Sheets

(56) References Cited

U.S. PATENT DOCUMENTS

| | | | | |
|---|---|---|---|---|
| 2012/0273963 A1* | 11/2012 | Mirsky | ............... | H01L 23/3735 257/774 |
| 2014/0210091 A1* | 7/2014 | Ono | ........................ | H01L 21/50 257/762 |
| 2014/0227832 A1* | 8/2014 | Wang | .................... | H01L 21/561 438/124 |
| 2015/0325763 A1* | 11/2015 | Oda | .................... | H01L 21/6835 257/99 |
| 2016/0254214 A1* | 9/2016 | Makino | ............. | H01L 23/49582 257/676 |
| 2017/0125328 A1* | 5/2017 | Hayashi | ............ | H01L 23/49503 |

\* cited by examiner

SEMICONDUCTOR PACKAGE SUBSTRATE AND METHOD FOR MANUFACTURING SAME

CROSS-REFERENCE TO RELATED APPLICATION

This application is a divisional of U.S. patent application Ser. No. 16/079,965, filed on Aug. 24, 2018, which is a national phase entry under 35 U.S.C. § 371 of International Application No. PCT/KR2016/012915, filed Nov. 10, 2016, entitled "SEMICONDUCTOR PACKAGE SUBSTRATE AND METHOD FOR MANUFACTURING SAME," which designates the United States of America, which claims priority to KR Application No. 10-2016-0031464, filed Mar. 16, 2016, the entire disclosures of each of these applications are hereby incorporated by reference in their entireties and for all purposes.

TECHNICAL FIELD

The present disclosure relates to a semiconductor package substrate and a method of manufacturing the semiconductor package substrate

BACKGROUND ART

Semiconductor devices are used by being packaged on a semiconductor package substrate. Semiconductor package substrates used for packaging have fine circuit patterns and/or I/O terminals. As high performance and/or high integration of a semiconductor device and miniaturization and/or high performance of an electronic apparatus using a semiconductor progress, a line width in a fine circuit pattern of a semiconductor package substrate further decreases and complexity thereof increases as well.

In the manufacture of an existing semiconductor package substrate, a through-hole is formed by using a copper clad laminate (CCL) in which copper foil is coated on an insulating material, and an inner surface of the through-hole is plated with gold to electrically connect an upper surface of copper foil and a lower surface of copper foil. Then, each of the upper surface of copper foil and the lower surface of copper foil is patterned using a photoresist to manufacture the semiconductor package substrate. However, the above conventional semiconductor package substrate manufacturing method may be complicated and have low accuracy.

DETAILED DESCRIPTION OF THE DISCLOSURE

Technical Problem

Provided is a method of manufacturing a semiconductor package substrate, by which a manufacturing process is simplified and pattern accuracy is improved, to thereby prevent a defect due to wire bonding, and a method of manufacturing the semiconductor package substrate.

Additional aspects will be set forth in part in the description which follows and, in part, will be apparent from the description, or may be learned by practice of the presented embodiments.

Technical Solution

According to an aspect of the present disclosure, a semiconductor package substrate, in which a base substrate having an upper surface and a lower surface and formed of a conductive material is filled with resin formed of an insulating material, includes a die pad formed of the conductive material on the upper surface, and a lead arranged on the upper surface by being electrically separated from the die pad and comprising a bonding pad that is a wire bonding area, in which the bonding pad includes a protrusion protruding toward the lower surface, and the protrusion is surrounded by the resin.

Advantageous Effects of the Disclosure

Since the embodiments of the present disclosure adopt a structure in which the base substrate is filled with resin and the resin surrounds the lower portion of the bonding pad, the process is simplified and the pattern accuracy is improved so that, when wire bonding is performed on the bonding pad, a defect due to the wire bonding may be prevented.

The scope of the present disclosure is not limited by the above-described effects.

BEST MODE

Figure 1:
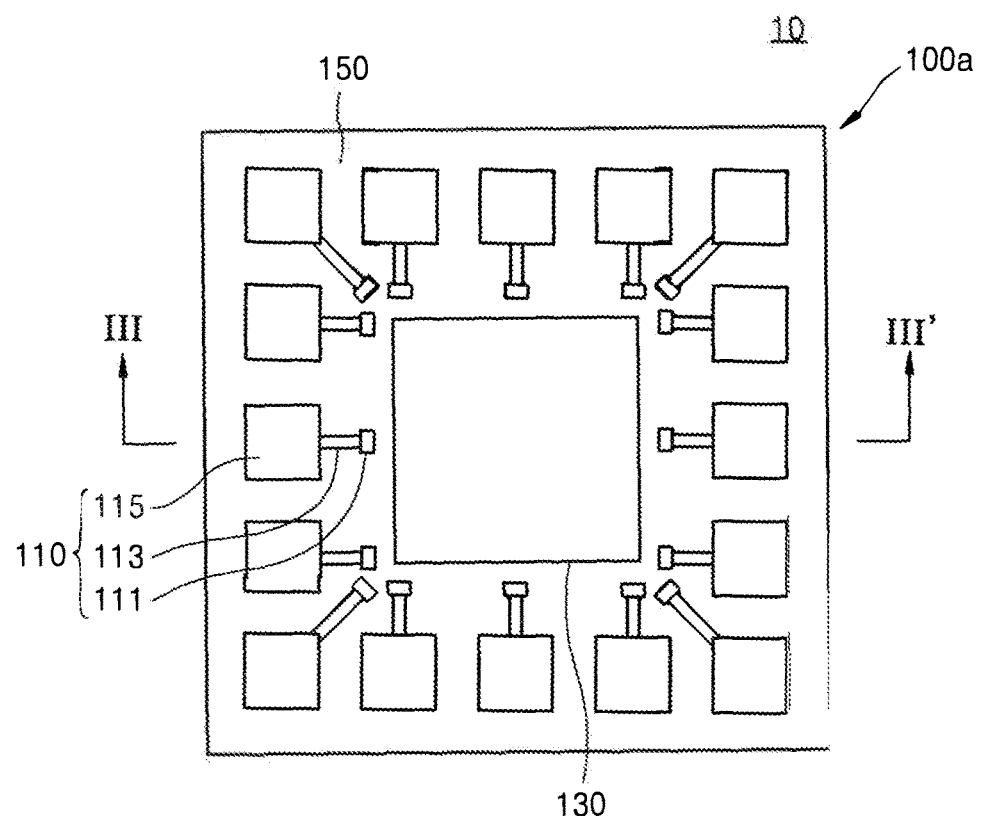
FIG. 1 is a schematic plan view of an upper surface of a semiconductor package substrate according to an embodiment.

According to an aspect of the present disclosure, a semiconductor package substrate, in which a base substrate having an upper surface and a lower surface and formed of a conductive material is filled with resin formed of an insulating material, includes a die pad formed of the conductive material on the upper surface, and a lead arranged on the upper surface by being electrically separated from the die pad and comprising a bonding pad that is a wire bonding area, in which a protrusion protruding toward the lower surface is formed in a central area of the bonding pad, and a central thickness of the bonding pad is greater than a peripheral thickness of the bonding pad.

The lead may further include a connection pattern connected to the bonding pad, and the central thickness of the bonding pad may be greater than a thickness of the connection pattern.

A lower portion of the connection pattern and the bonding pad may be filled with the resin.

The lead may further include a lead pad connected to the bonding pad, and a die land integrally formed with the die pad and a lead land integrally formed with the lead pad may be provided on the lower surface.

Part of the resin between the die pad and the bonding pad may be exposed, and the die pad, the bonding pad, and the exposed resin may have the same height level.

The semiconductor package substrate may further include a semiconductor chip mounted on the die pad, and a wire boned to the semiconductor chip and the bonding pad.

According to another aspect of the present disclosure, a method of manufacturing a semiconductor package substrate includes forming a trench in a lower surface of a base substrate of a conductive material, filling the trench with resin, curing the resin, removing the resin exposed from the trench, and forming a die pad having a flat surface and a lead separated from the die pad on an upper surface of the base substrate, by patterning an opposite surface of the base substrate to expose at least a part of the resin filling the trench, in which the lead comprises a bonding pad having a flat surface and a connection pattern connected to the bonding pad, at least a part of the trench is formed in an area corresponding to the lead, the trench has a first depth of an area corresponding to the bonding pad and a second depth of an area corresponding to the connection pattern, and the first depth is smaller than the second depth, and the bonding pad that is an area where a wire is bonded comprises a protrusion protruding toward the lower surface, and the central thickness of the bonding pad is greater than a peripheral thickness of the bonding pad.

The method may further include roughening an inner surface of the trench.

The trench may be formed by a half-tone mask process.

The method may further include forming a plated layer on the lead.

According to another aspect of the present disclosure, a semiconductor package substrate, in which a base substrate having an upper surface and a lower surface and formed of a conductive material is filled with resin formed of an insulating material, include a die pad formed of the conductive material on the upper surface, a lead arranged on the upper surface by being electrically separated from the die pad, and comprising a bonding pad that is a wire bonding area, a connection pattern, and a lead pad, and a lead land integrally formed with the lead pad on the lower surface, in which the bonding pad comprises a protrusion protruding toward the lower surface, the connection pattern connects the bonding pad and the lead pad, and a central thickness of the bonding pad is greater than a thickness of the connection pattern.

The central thickness of the bonding pad may have a value of about 50 μm to about 90 μm, and the thickness of the connection pattern may have a value of about 10 μm to about 40 μm.

A lower portion of the connection pattern and the bonding pad may be filled with the resin.

The protrusion may be surrounded by the resin.

The lead may further include the lead pad connected to the bonding pad, and a die land integrally formed with the die pad and a lead land integrally formed with the lead pad are provided on the lower surface.

MODE OF THE DISCLOSURE

As the disclosure allows for various changes and numerous embodiments, embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the disclosure.

The present disclosure will now be described more fully with reference to the accompanying drawings, in which embodiments of the disclosure are shown. Throughout the drawings, like reference numerals in the drawings denote like elements, and thus their description will be omitted.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

In the description of each element, when an element is formed "on" or "under" another element, it will be understood that the element can be directly on the other component or intervening components may be present thereon. The standard for determining the terms "on" and "under" is based on the drawings.

Sizes of components in the drawings may be exaggerated for convenience of explanation. In other words, since sizes and thicknesses of components in the drawings are arbitrarily illustrated for convenience of explanation, the following embodiments are not limited thereto.

Figure 2:
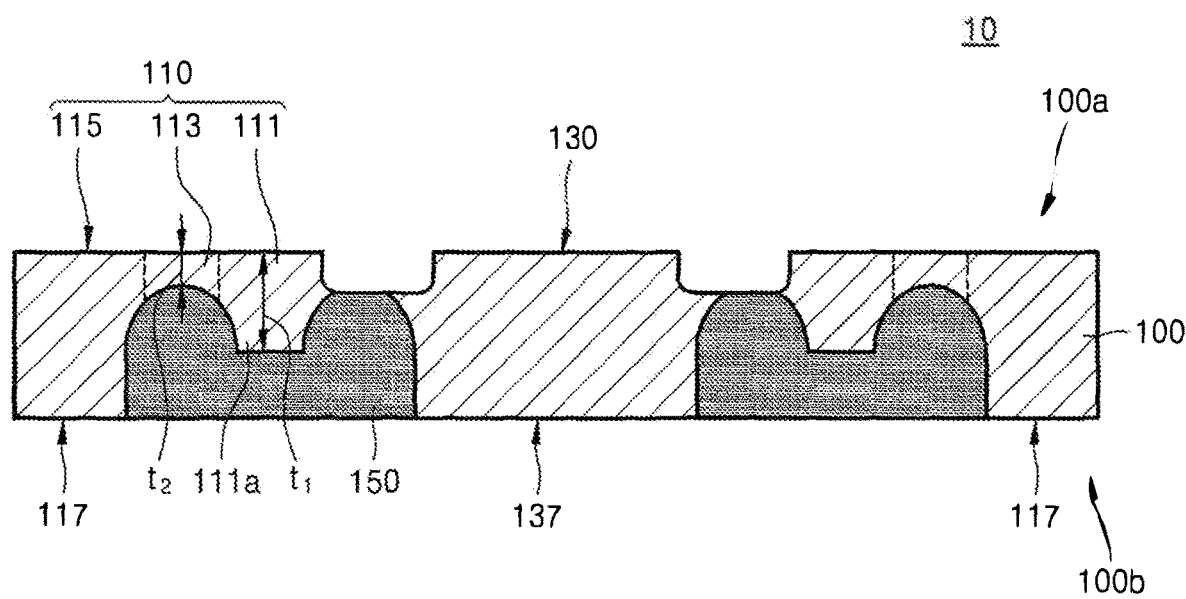
FIG. 2 is a cross-sectional view taken along line III-III' of FIG. 1.

FIG. 1 is a schematic plan view of an upper surface 100a of a semiconductor package substrate 10 according to an embodiment. FIG. 2 is a cross-sectional view taken along line III-III' of FIG. 1.

Referring to FIGS. 1 and 2, the semiconductor package substrate 10 according to the present embodiment may include the upper surface 100a and a lower surface 100b, and a base substrate 100 formed of a conductive material is filled with resin 150 formed of an insulating material. A die pad 130 and a lead 110 including a bonding pad 111 are provided on the upper surface 100a.

The upper surface 100a of the base substrate 100 may refer to a side where a semiconductor chip is provided when a semiconductor package is manufactured by using the semiconductor package substrate 10, and the lower surface 100b may refer to a surface opposite to the upper surface 100a.

The base substrate 100 is formed of a conductive material and may have a flat panel shape. For example, the base substrate 100 may include Fe or an Fe alloy such as Fe—Ni or Fe—Ni—Co, or Cu or a Cu alloy such as Cu—Sn, Cu—Zr, Cu—Fe, or Cu—Zn.

The resin 150 may be formed of an insulating material that is not electrically conductive. The resin 150 may later electrically insulate between wiring patterns of the semiconductor package substrate 10. The resin 150 may be arranged between the die pad 130 and the lead 110 to insulate the die pad 130 and the lead 110 from each other. At least part of the resin 150 may be arranged under the lead 110. The height of the resin 150 arranged under a peripheral area surrounding the bonding pad 111 may be higher than the height of the resin 150 arranged under the bonding pad 111. Accordingly, the resin 150 may surround a portion under the bonding pad 111 and hold the bonding pad 111.

The die pad 130 is a portion where the semiconductor chip is to be mounted. The die pad 130 may be located at the center portion of the semiconductor package substrate 10, but the present disclosure is not limited thereto. The die pad 130 is formed by patterning the base substrate 100 and may be formed of the same conductive material as the base substrate 100.

The lead 110 is arranged around the die pad 130 so as to be electrically insulated from the die pad 130. The lead 110 may be provided as a plurality thereof and may have a specific pattern. The lead 110 is electrically connected to the semiconductor chip and is a portion to be electrically connected to an external circuit. The lead 110 may be formed by patterning the base substrate 100 and may be formed of the same conductive material as the base substrate 100. The die pad 130 and the lead 110 may be formed from the base substrate 100 and may be formed of the same conductive material.

The lead 110 may include the bonding pad 111 that is a wire bonding area. The lead 110 may include a connection pattern 113 and a lead pad 115 which are connected to the bonding pad 111.

The bonding pad 111 is an area where a wire is connected by wire bonding when a semiconductor chip (not shown) and the lead 110 are connected to each, and may have a flat surface. A lower portion of the bonding pad 111 may include a protrusion 111a protruding toward the lower surface 100b of the base substrate 100. The protrusion 111a is surrounded by the resin 150. In other words, the protrusion 111a is embedded in the resin 150. Accordingly, a central thickness t1 of the bonding pad 111 is greater than the thickness of other peripheral patterns. For example, the central thickness t1 of the bonding pad 111 is greater than a thickness t2 of the connection pattern 113. In some embodiments, the central thickness t1 of the bonding pad 111 may be about 50 µm to about 90 µm, and the thickness t2 of the connection pattern 113 may be about 10 µm to about 40 µm. The thickness of the bonding pad 111 may be determined considering a pressure by the wire bonding, a bonding force of the resin 150, an etching time for etching a pattern, etc. The thickness of the connection pattern 113 may be determined considering process conditions and handling of the base substrate 100.

According to the above structure, a contact area between the bonding pad 111 and the resin 150 increases so that a bonding force between the bonding pad 111 and the resin 150 may increase. Accordingly, when wire bonding is performed on the bonding pad 111, a defect due to the wire bonding may be prevented.

The bonding pad 111 may be connected to the lead pad 115 by the connection pattern 113. The lead pad 115 is connected to a lead land 117 arranged on the lower surface 100b of the base substrate 100. Since the lead land 117 is integrally formed with the lead pad 115, the lead land 117 may be formed of the same conductive material as the lead pad 115. The lead land 117 is electrically and physically connected to the external circuit by solder balls may connect the semiconductor package substrate 10 and the external circuit to each other.

The die pad 130 is connected to a die land 137 arranged on the lower surface 100b of the base substrate 100. Since the die land 137 is integrally formed with the die pad 130, the die land 137 may be formed of the same conductive material as the die pad 130. The die land 137 that is electrically and physically connected to the external circuit by solder balls may connect the semiconductor package substrate 10 and external circuit to each other.

Figure 3:
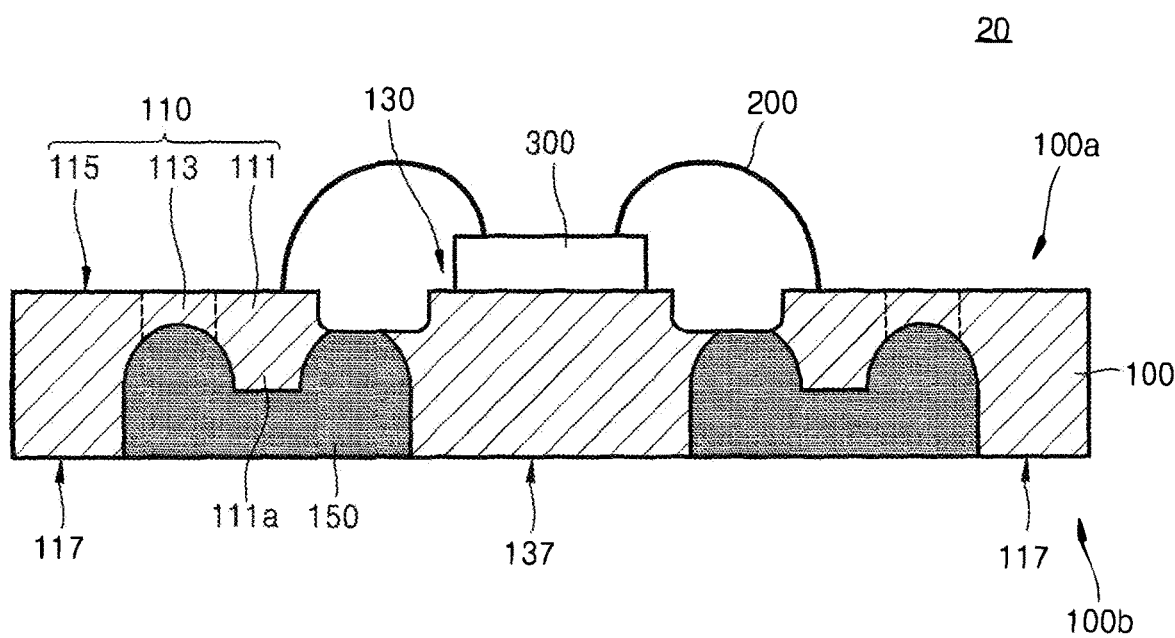
FIG. 3 is a cross-sectional view of a semiconductor package substrate mounted with a semiconductor chip.

FIG. 3 is a cross-sectional view of a semiconductor package substrate 20 mounted with a semiconductor chip 300. In FIG. 3, the same reference numerals as the reference numerals in FIG. 2 denote the same elements, and thus their descriptions are omitted for simplification of explanation.

In the semiconductor package substrate 20, the base substrate 100 formed of a conductive material is filled with the resin 150 formed of an insulating material, and the die pad 130 and the lead 110 including the bonding pad 111 are provided on the upper surface 100a of the base substrate 100.

The semiconductor chip 300 is mounted on a flat upper surface of the die pad 130. The die pad 130 and the lead 110 may be electrically and physically connected to each other by a wire 200. The wire 200 may be connected to the semiconductor chip 300 and the lead 130 by wire bonding. One end of the wire 200 is attached to the bonding pad 111 of the lead 130, and the other end of the wire 200 is connected to the semiconductor chip 300.

The bonding pad 111 is an area where a wire is connected by wire bonding when a semiconductor chip (not shown) and the lead 110 are connected to each, and may have a flat surface. A lower portion of the bonding pad 111 may include a protrusion 111a protruding toward the lower surface 100b of the base substrate 100. The protrusion 111a is surrounded by the resin 150. In other words, the protrusion 111a is embedded in the resin 150. Accordingly, a central thickness t1 of the bonding pad 111 is greater than the thickness of other peripheral patterns.

According to the above structure, a contact area between the bonding pad 111 and the resin 150 increases so that a bonding force between the bonding pad 111 and the resin 150 may increase. Accordingly, when wire bonding is performed on the bonding pad 111, a defect due to the wire bonding may be prevented.

Figure 4:
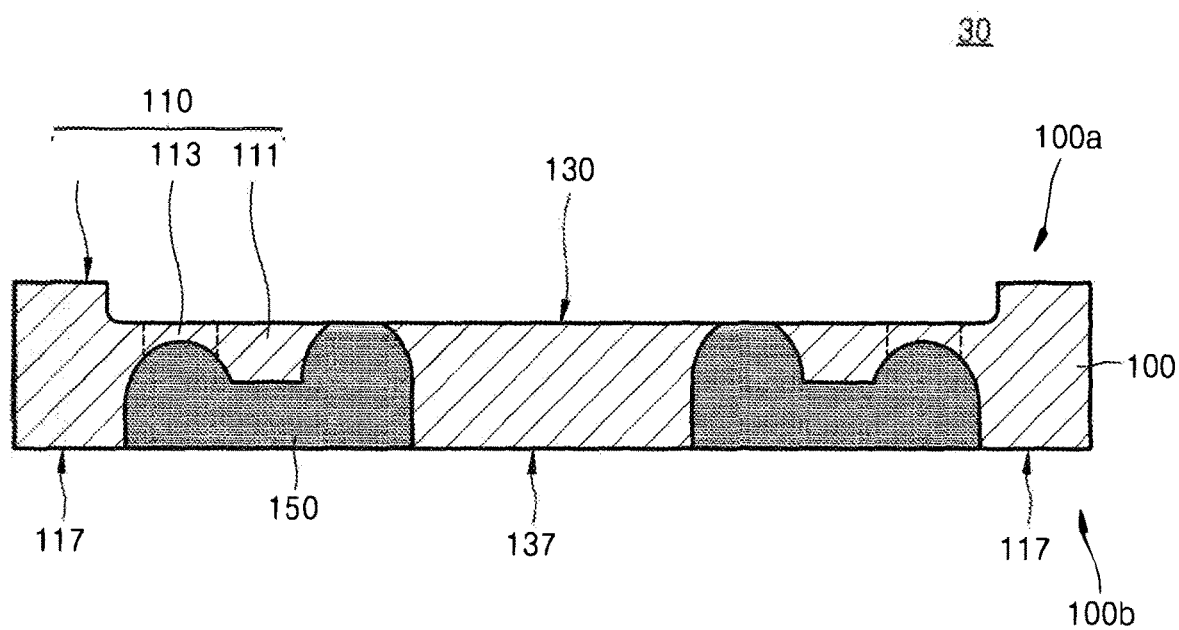
FIG. 4 is a cross-sectional view of a semiconductor package substrate according to another embodiment.

FIG. 4 is a cross-sectional view of a semiconductor package substrate 30 according to another embodiment. In FIG. 4, the same reference numerals as the reference numerals in FIG. 2 denote the same elements, and thus their descriptions will be omitted for simplification of explanation.

In the semiconductor package substrate 30, the base substrate 100 formed of a conductive material is filled with the resin 150 formed of an insulating material. The die pad 130 and the lead 110 including the bonding pad 111 are provided on the upper surface 100a of the base substrate 100.

The bonding pad 111 is an area where a wire is connected by wire bonding when the semiconductor chip and the lead 110 are connected to each, and may have a flat surface. The lower portion of the bonding pad 111 may include the protrusion 111a protruding toward the lower surface 100b of the base substrate 100. The protrusion 111a is surrounded by the resin 150. In other words, the protrusion 111a is embedded in the resin 150. Accordingly, the central thickness t1 of the bonding pad 111 is greater than the thickness of other peripheral patterns.

The height of the resin 150 around the bonding pad 111 may be various. For example, the height of the resin 150 arranged between the lead 110 and the die pad 130 may be higher than the height of the resin 150 arranged under the connection pattern 113, and a variety of modifications thereof are possible.

The die pad 130 may have the same height level as the bonding pad 111. Furthermore, the die pad 130 may have the same height level as the resin 150 exposed from the upper surface 100a of the base substrate 100. This means that the die pad 130 may be formed as the base substrate 100 is etched. The height of the die pad 130 may be various. For example, the die pad 130 may be formed to be lower than the height level of the bonding pad 111.

FIGS. 5A to 5E are sectional views sequentially illustrating a method of manufacturing the semiconductor package substrate 10, according to an embodiment.

Figure 5A:
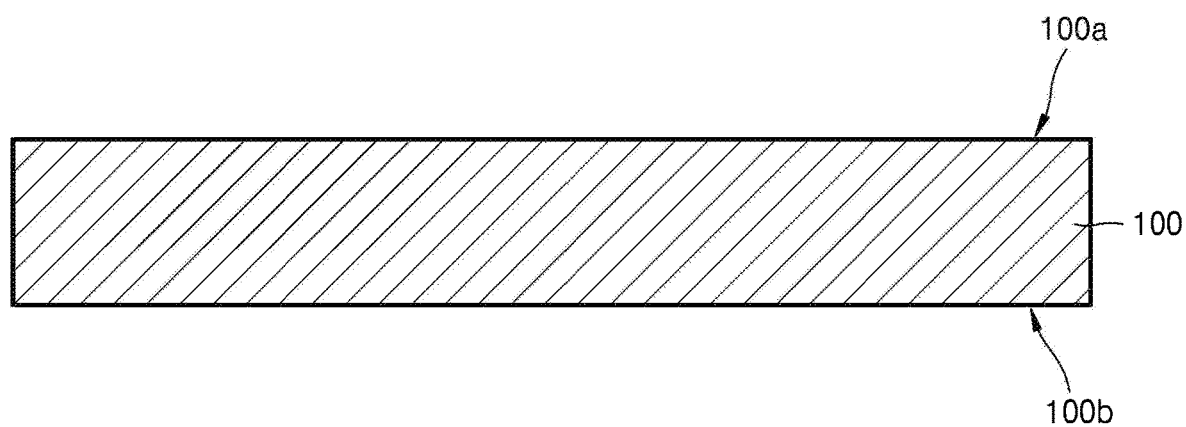
FIGS. 5A to 5E are sectional views sequentially illustrating a method of manufacturing a semiconductor package substrate according to an embodiment.

First, referring to FIG. 5A, the base substrate 100 formed of a conductive material is prepared. The base substrate 100 may have a flat panel shape including a conductive material. The base substrate 100 may include Fe or an Fe alloy such as Fe—Ni or Fe—Ni—Co, or Cu or a Cu alloy such as Cu—Sn, Cu—Zr, Cu—Fe, or Cu—Zn.

Figure 5B:
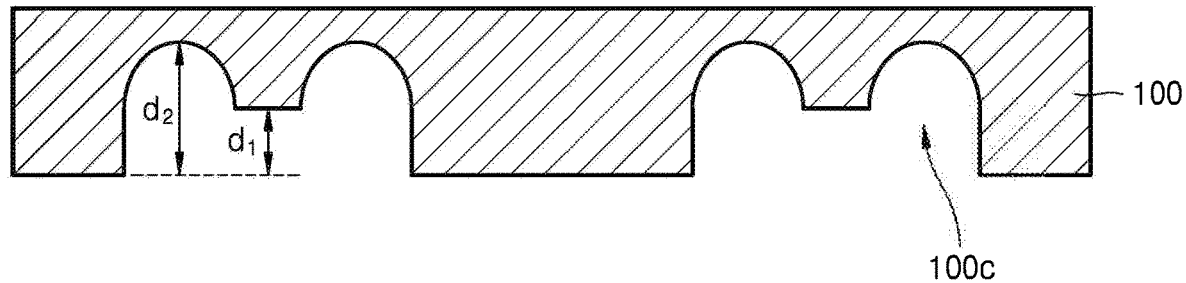

Next, referring to FIG. 5B, a trench 100c is formed in the lower surface 100b of the base substrate 100. This indicates that, in this case, the trench 100c does not completely penetrate through the base substrate 100.

In order to form the trench 100c, a photoresist (PR) formed of a photosensitive material is coated on the lower surface 100b of the base substrate 100, and exposure and development processes are performed by using a half-tone mask, to thereby expose only a portion where the trench 100c of the base substrate 100 is to be formed. Then, a portion of the lower surface 100b of the base substrate 100, which is not covered with the PR, is etched by using an etchant such as copper chloride or iron chloride, so that, as illustrated in FIG. 5B, the trench 100c may be formed in the lower surface 100b without penetrating through the base substrate 100.

The trench 100c may have different depths d1 and d2. At least a part of the trench 100c is formed in an area corresponding to the lead 110 (see FIG. 5E) that is formed later. In the trench 100c, an area corresponding to the bonding pad 111 (see FIG. 5E) has a first depth d1 and an area corresponding to the connection pattern 113 (see FIG. 5E) has a second depth d2. In this state, the first depth d1 is smaller than the second depth d2 (d1<d2).

The second depth d2 of the trench 100c may be about 80% to about 90% of the thickness of the base substrate 100. For example, the thickness of a remaining part of the base substrate 100 where the trench 100c having the second depth d2 is formed may be about 10 μm to about 40 μm.

When the second depth d2 of the trench 100c increases more than the above thickness, handling of the base substrate 100 or the semiconductor package substrate 10 may not be easy in the manufacturing process of the semiconductor package substrate 10 or a subsequent packaging process thereof. Furthermore, when the second depth d2 of the trench 100c increases more than the above thickness, in some cases, a through-hole penetrating through the lower surface 100b and the upper surface 100a of the base substrate 100 may be formed due to allowance in the forming of a groove or the trench 100c When the second depth d2 of trench 100c decreases less than the above thickness, a subsequent process may not be easy in the manufacturing of semiconductor package substrate 10 later.

The thickness of a remaining part of the base substrate 100 where the trench 100c having the first depth d1 is formed may be about 50 μm to about 90 μm. When the first depth d1 of the trench 100c increase more than the above thickness, a bonding force between the bonding pad 111 and the resin 150 may be weak. When the first depth d1 of the trench 100c decreases less than the above thickness, a subsequent process may not be easy in the manufacturing of the semiconductor package substrate 10 later. A half-tone mask may be used to form the trench 100c as above. The PR having a different thickness according to areas may be formed by adjusting a transmission amount of light by using the half-tone mask. Then, the trench 100c having different depths d1 and d2 may be formed through an etching process.

A remaining part of the lower surface 100b of the base substrate 100, which is not removed, that is, a part other than the trench 100c, may function as a wiring pattern later.

Figure 5C:
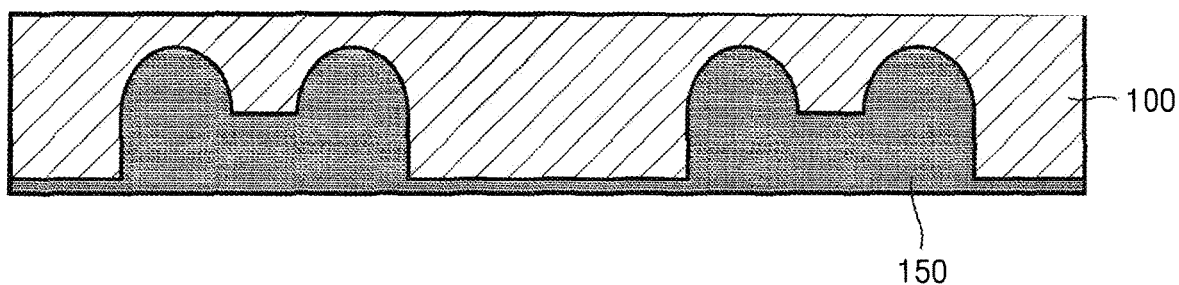

Next, as illustrated in FIG. 5C, the trench 100c of the base substrate 100 is filled with the resin 150. It is sufficient that the resin 150 is formed of an insulating material that is not electrically conductive. For example, the resin 150 may be thermosetting resin that is cured by being polymerized through heat treatment. The resin 150 may electrically insulate between the wiring patterns of the semiconductor package substrate 10 later. The filling of the resin 150 may be performed by using a liquid resin material or a solid tape including a resin component. After the filling of the resin 150, the resin 150 is thermally cured.

When the resin 150 is filled and cured, as illustrated in FIG. 5C, the resin 150 may cover not only the inside of the trench 100c of the base substrate 100, but also at least a part of the lower surface 100b of the base substrate 100. As such, when the resin 150 is coated excessively, the excessively coated resin 150 is removed by mechanical processing such as brushing, grinding, or polishing, or chemical resin etching so that, as illustrated in FIG. 5D, the resin 150 may be located only in the trench 100c of the base substrate 100.

Figure 5D:
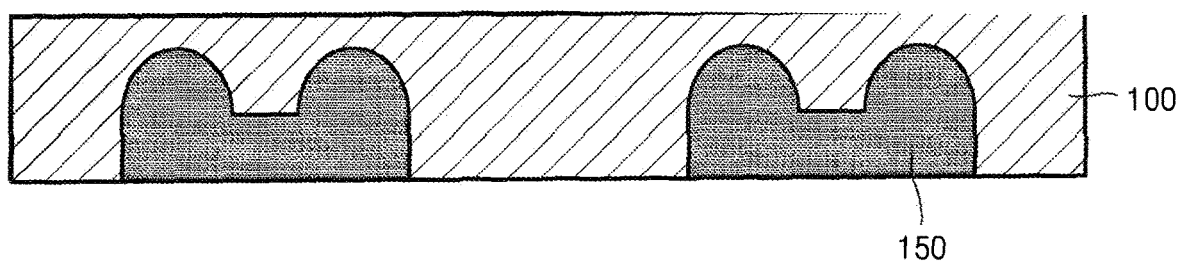

Also, it may be considered that, when filling the resin 150, instead of excessively filling the resin 150, as illustrated in FIG. 5D, only the trench 100c of the base substrate 100 may be filled with the resin 150. In this case, however, it is a problem that the trench 100c of the base substrate 100 may not be appropriately filled with the resin 150.

Figure 5E:
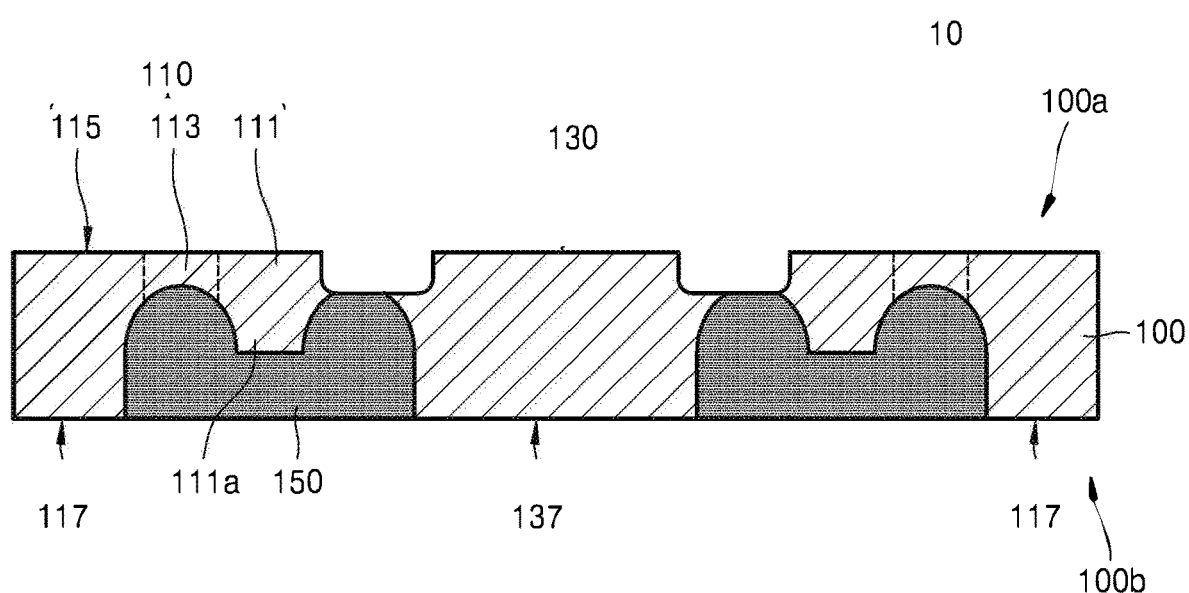

Then, the upper surface 100a of the base substrate 100 is etched, as illustrated in FIG. 5E, so that the resin 150 filling the trench 100c is exposed from an upper portion of the base substrate 100. The upper surface 100a of the base substrate 100 may be etched in various methods. For example, a dry film photoresist (DFR) including a photosensitive material is laminated on the upper surface 100a of the base substrate 100 and undergoes through exposure and development processes so that only a part of the upper surface 100a of the base substrate 100 that is to be etched may be exposed. Then, a part of the upper surface 100a of the base substrate 100 that is not covered with the DFR is etched by using an etchant such as copper chloride or iron chloride so that, as illustrated in FIG. 5E, at least a part of the resin 150 may be exposed from the upper surface 100a of the base substrate 100.

The die pad 130 and the lead 110 may be formed by the above patterning process. The lead 110 may include the bonding pad 111 and the connection pattern 113, and the bonding pad 111 has a flat surface. The lower portion of the bonding pad 111 may include the protrusion 111a protruding toward the lower surface 100b of the base substrate 100, and the protrusion 111a is surrounded by the resin 150. In other words, the protrusion 111a is embedded in the resin 150. Accordingly, the central thickness t1 of the bonding pad 111 is greater than the thickness of other peripheral patterns. For example, the central thickness t1 of the bonding pad 111 is greater than the thickness t2 of the connection pattern 113.

Then, an additional process may be performed as necessary. For example, a plated layer may be formed on the lead 110 and/or the die pad 130. The plated layer may be plated by using Au, Ag, Ni, Pd, etc. The plated layer may increase a wire bonding force of the lead 110 or a solder adhesion force of the die pad 130.

In the methods of manufacturing a semiconductor package substrate according to the above-described embodiments, a process of roughening the inner surface of the trench 100c may be performed prior to the filling of the resin 151a in the trench 100c of the base substrate 100. Accordingly, a bonding force between the resin 150 and the base substrate 100 may be remarkably increased. To roughen the inner surface of the trench 100c of the base substrate 100, plasma processing, ultraviolet processing, or an acid-based solution) may be used. In this case, the roughness of the inner surface of the trench 100c of the base substrate 100 may be about 150 nm or more (rms).

Although the method of manufacturing a semiconductor package substrate is described above, the present disclosure is not limited thereto. For example, a semiconductor package manufactured by using the above manufacturing method may belong to the scope of the present disclosure.

As described above, according to the present disclosure, since the base substrate is filled with the resin and the resin surrounds the lower portion of the bonding pad, the process is simplified and the pattern accuracy is improved so that, when wire bonding is performed on the bonding pad, a defect due to the wire bonding may be prevented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

The invention claimed is:

1. A method of manufacturing a semiconductor package substrate, the method comprising:
   forming a trench in a lower surface of a base substrate of a conductive material;
   filling the trench with resin;
   curing the resin;
   removing the resin exposed from the trench; and
   forming a die pad having a flat surface and a lead separated from the die pad on an upper surface of the base substrate, by patterning the upper surface of the base substrate to expose at least a part of the resin filling the trench, wherein:
   the lead comprises a bonding pad having a flat surface and a connection pattern connected to the bonding pad,
   at least a part of the trench is formed in an area corresponding to the lead, the trench has a first depth of an area corresponding to the bonding pad and a second depth of an area corresponding to the connection pattern, and the first depth is smaller than the second depth,
   the bonding pad that is an area where a wire is bonded comprises a protrusion protruding toward the lower surface, and
   a central thickness of the bonding pad is less than a total thickness of the base substrate and the central thickness is greater than a peripheral thickness of the bonding pad, and the protrusion is embedded in the resin with portions of the resin in contact with a side and an end of the protrusion.

2. The method of claim 1, further comprising roughening an inner surface of the trench.

3. The method of claim 1, wherein the trench is formed by a half-tone mask process.

4. The method of claim 1, further comprising forming a plated layer on the lead.

5. The method of claim 1, wherein the lead further comprises a lead pad connected to the bonding pad, and a die land integrally formed with the die pad and a lead land integrally formed with the lead pad are provided on the lower surface.

6. The method of claim 1, further comprising:
   mounting a semiconductor chip on the die pad; and
   performing a wire bonding to the semiconductor chip and the bonding pad.

7. The method of claim 1, wherein the central thickness of the bonding pad has a value of about 50 µm to about 90 µm, and a thickness of the connection pattern has a value of about 10 µm to about 40 µm.

* * * * *